United States Patent

Kiyota

[11] Patent Number: 6,119,709
[45] Date of Patent: Sep. 19, 2000

[54] FEEDING APPARATUS AND REPLENISHING METHOD OF PROCESSING SOLUTION

[75] Inventor: Kenji Kiyota, Kumamoto-ken, Japan

[73] Assignee: Tokyo Electron Ltd., Japan

[21] Appl. No.: 09/406,834

[22] Filed: Sep. 28, 1999

[30] Foreign Application Priority Data

Sep. 28, 1998 [JP] Japan ................................. 10-288677

[51] Int. Cl.$^7$ ................................................. G03D 3/06
[52] U.S. Cl. ....................... 137/1; 137/624.11; 137/487.5
[58] Field of Search .................................... 137/1, 624.11, 137/624.13, 487.5

[56] References Cited

U.S. PATENT DOCUMENTS 5,059,998 10/1991 Sasaki et al. .................. 137/624.11 X
5,069,883 12/1991 Matonte .......................... 137/624.11 X

FOREIGN PATENT DOCUMENTS 2-77752 3/1990 Japan .
2-78431 3/1990 Japan .

*Primary Examiner*—Kevin Lee
*Attorney, Agent, or Firm*—Rader, Fishman&Grauer

[57] ABSTRACT

In the case of a feeding apparatus which automatically performs drainage of a processing solution from a first tank and replenishment of the first tank with a processing solution by the use of a timer, when a pipe for sending NH4OH from the first tank to a scrubbing unit (SCR) is clogged, no liquid level is detected by a lowermost limit sensor before a set time of a replenishment timer expires, whereby replenishment of NH4OH is not started. Consequently, there never arises such a situation that remaining NH4OH and new NH4OH are mixed in the first tank.

24 Claims, 13 Drawing Sheets

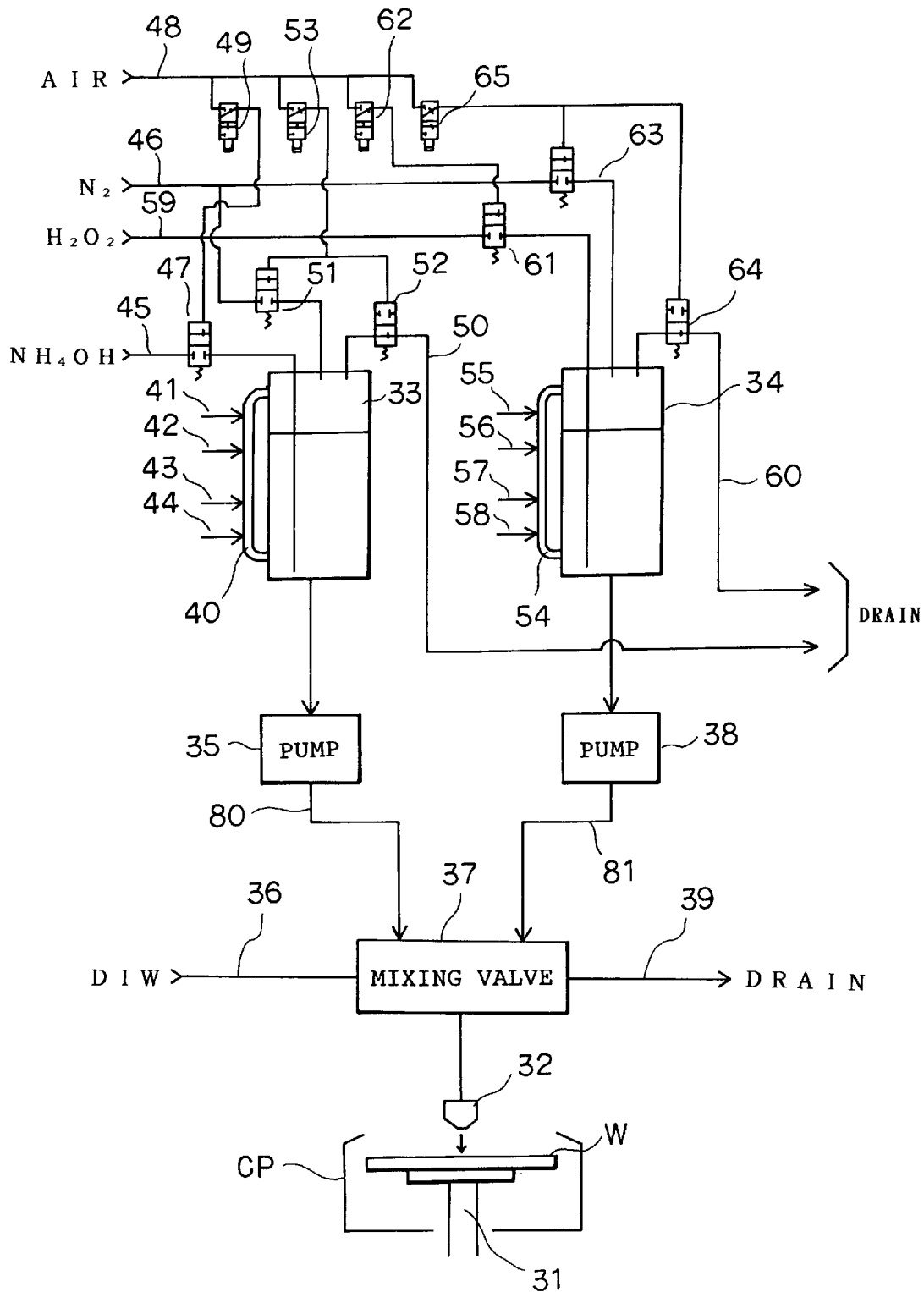
F I G. 4

FEEDING APPARATUS AND REPLENISHING METHOD OF PROCESSING SOLUTION

BACKGROUND OF THE INVENTION

1. Field of the Invention

The present invention relates to a feeding apparatus for feeding a scrubbing solution to a scrubbing apparatus, for example, for scrubbing a semiconductor wafer and a replenishing method of a processing solution in the feeding apparatus.

2. Description of the Related Art

In processes of semiconductor device fabrication, the photolithography technology is used. In the photolithography technology, a resist is coated on a surface of a semiconductor wafer (hereinafter referred to only as "a wafer"), and the coated resist is exposed to a predetermined pattern and developed. Thus, the predetermined pattern of resist film is formed on the wafer, and moreover the predetermined pattern of circuit is formed by film-formation and etching.

Hitherto, such a series of resist processing is performed using a coating and developing system in which, for example, a resist solution coating unit, a developing unit, a heating unit, a scrubbing unit, and the like are integrated.

In the scrubbing unit, liquid phase scrubbing by the use of a scrubbing solution in which, for example, NH4OH and H2O2 (both called processing solutions) are mixed is performed. These processing solutions deteriorate as time passes. Therefore, in a feeding apparatus for feeding a processing solution to the scrubbing unit, when a processing solution is stored in a storage container for more than a predetermined period of time without being used, the processing solution is drained from the container and the container is replenished with a new processing solution.

However, when the drainage of a processing solution from the container and the replenishment of the container with a processing solution are automatically performed in the feeding apparatus, it is possible that the supply of the processing solution is started after a predetermined time lapse from when the drainage of the processing solution is started by the use of a timer.

However, in the case where drainage of a processing solution from a container and replenishment of the container with a processing solution are automatically performed, there is a disadvantage that when a pipe for sending the processing solution from the container to a scrubbing unit is clogged, for example, there arises such a situation that an old processing solution remains in the container even if a set time of a timer expires and thereby the old processing solution and a new processing solution are mixed.

SUMMARY OF THE INVENTION

The present invention is made to eliminate the above disadvantage, and an object of the present invention is to provide a feeding apparatus and a replenishing method capable of performing the replacement of a processing solution in the container more smoothly.

To attain the above object, a first aspect of the present invention is a feeding apparatus for feeding a processing solution to a processing apparatus for performing predetermined processing, comprising a container for storing the processing solution to be supplied to the processing apparatus, a first sensor for detecting a first liquid level at which the processing solution stored in the container needs to be replenished, a second sensor for detecting a second liquid level lower than the first liquid level, replenishing means for replenishing the container with a processing solution when the first liquid level is detected by the first sensor, a first timer starting to operate when the processing solution is replenished by the replenishing means and measuring time for a predetermined period of time, means for starting drainage of the processing solution in the container when the set time of the first time expires without the first sensor detecting the first liquid level, a second timer starting to operate when drainage of the processing solution in the container is started and measuring time for a predetermined period of time, and means for starting replenishment of the container with a processing solution when the second liquid level is detected by the second sensor before the set time of the second timer expires. In the present invention, when a pipe for sending a processing solution from the container to the scrubbing unit is clogged, the second liquid level is not detected by the second sensor before the set time of the second timer expires, whereby replenishment of the container with a new processing solution is not started. As a result, there never arises such a situation that an old processing solution remaining in the container and a new processing solution are mixed, thus making it possible to replace a processing solution in the container more smoothly.

A second aspect of the present invention is a feeding apparatus for feeding a processing solution to a processing apparatus for performing predetermined processing, comprising a container for storing the processing solution to be supplied to the processing apparatus, a first sensor for detecting a first liquid level at which the processing solution stored in the container needs to be replenished, a second sensor for detecting a second liquid level at which replenishment of the processing solution needs to be stopped, means for starting replenishment of the container with a processing solution when the first liquid level is detected by the first sensor, a timer starting to operate when the replenishment of the processing solution is started and measuring time for a predetermined period of time, and means for stopping the replenishment of the processing solution when the second liquid level is not detected by the second sensor although the set time of the timer expires. In the present invention, when leakage of a processing solution due to a crack or the like occurs in the pipe for sending the processing solution from the container to the scrubbing unit, for example, the second liquid level is not detected by the second sensor even if the set time of the timer expires, whereby the replenishment of the container with a processing solution is stopped. Consequently, the replacement of a processing solution in the container can be more smoothly performed.

A third aspect of the present invention is a feeding apparatus for feeding a processing solution to a processing apparatus for performing predetermined processing, comprising a container for storing the processing solution to be supplied to the processing apparatus, a sensor for detecting a liquid level at which the processing solution stored in the container needs to be replenished, replenishing means for replenishing the container with a processing solution when the liquid level at which the processing solution needs to be replenished is detected by the sensor, a timer starting to operate when the processing solution is replenished by the replenishing means and measuring time for a predetermined period of time, retaining means for retaining this result when the set time of the timer expires without the sensor detecting the liquid level at which the processing solution needs to be replenished, and means for draining the processing solution in the container and replenishing the container with a new processing solution when the replenishment of the processing solution is requested by the processing apparatus and the aforesaid result is retained by the retaining means. However, the following problem arises if the replacement of a processing solution in the container is automatically performed when the storage time of the processing solution in the container is measured by the timer and more than the predetermined period of time passes. Specifically, when a processing solution is not used for a long period like the summer vacation, for example, the replacement of the processing solution is repeated many times during the vacation in the case of automatic replacement. For instance, if the processing solution in the container is replaced when unused time exceeds 40 hours, the replacement of the processing solution in the container is repeated approximately four times during the summer vacation, supposing that the period of the summer vacation is seven days, that is, 168 hours. Contrary to this, in the present invention, the replacement of a processing solution in the container is performed only after a processing request is made from the processing apparatus. In the above example of summer vacation, for example, the processing solution in the container is replaced only once during the summer vacation, thereby eliminating waste of a processing solution.

A fourth aspect of the present invention is a method for replenishing a container with a processing solution in a feeding apparatus for feeding a processing solution from the container storing the processing solution to a processing apparatus for performing predetermined processing, comprising the steps of (a) detecting leakage of the processing solution from the container, and (b) next to the step (a), replenishing the container with a processing solution, after the processing solution is drained when the processing solution remains in the container over a predetermined period of time, or after the determination is made when the processing solution does not remain over the predetermined period of time. In the present invention, leakage of a processing solution from the container is detected prior to automatic replacement of the processing solution in the container. Thus, the replacement of the processing solution can be performed more smoothly.

These objects and still other objects and advantages of the present invention will become apparent upon reading the following specification when taken in conjunction with the accompanying drawings.

BRIEF DESCRIPTION OF THE DRAWINGS

FIG. 4 is a view showing the configuration of a supply system in a scrubbing unit (SCR) shown in FIG. 2;

DETAILED DESCRIPTION OF THE PREFERRED EMBODIMENT

A preferred embodiment of the present invention will be explained based on the drawings.

Figure 1:
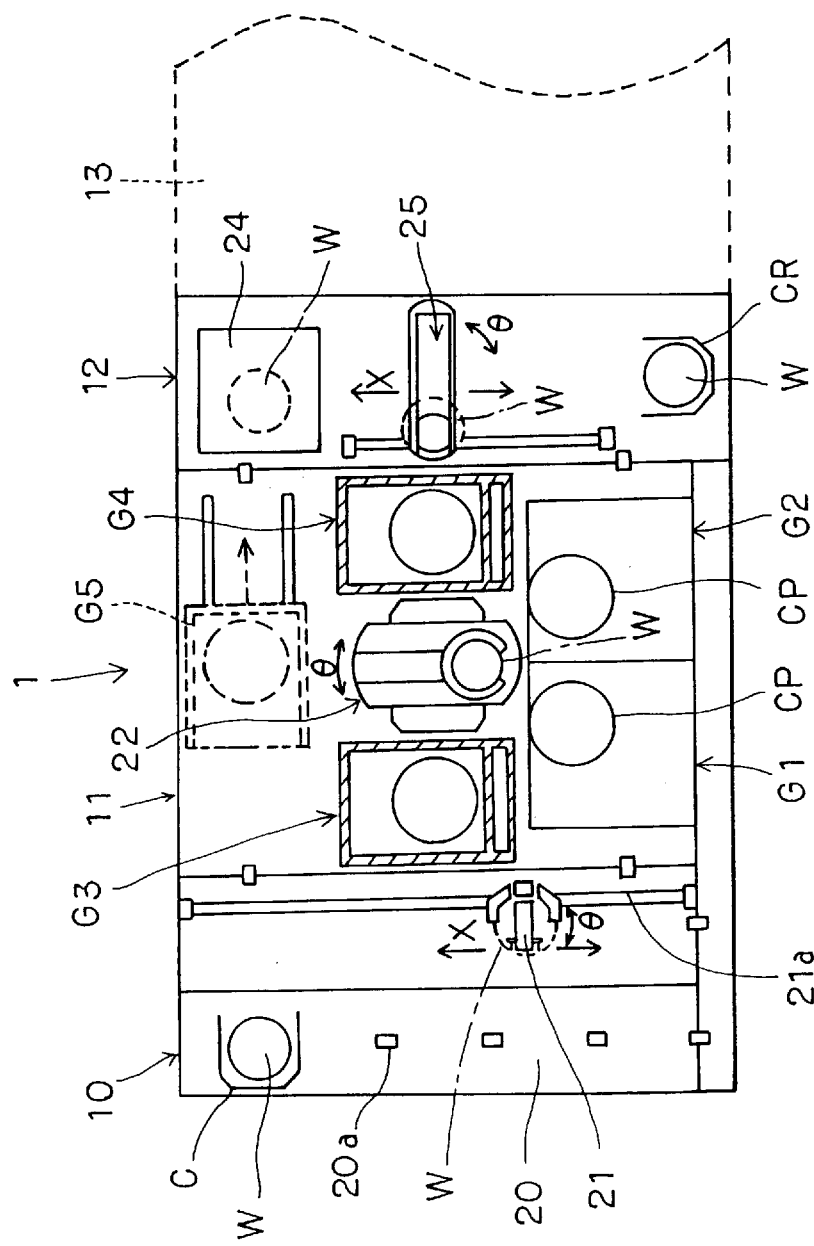
FIG. 1 is a plane view of a coating and developing system according to an embodiment of the present invention.
Figure 2:
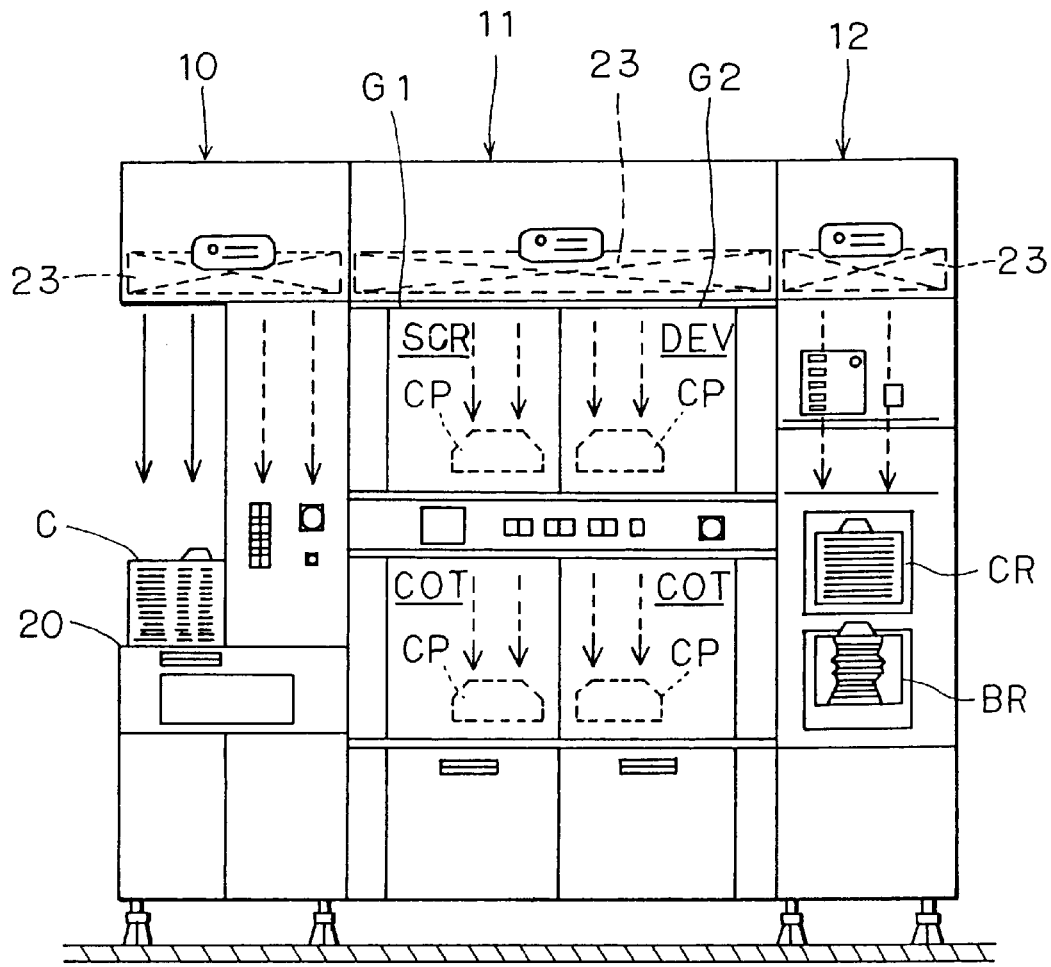
FIG. 2 is a front view of the coating and developing system shown in FIG. 1.
Figure 3:
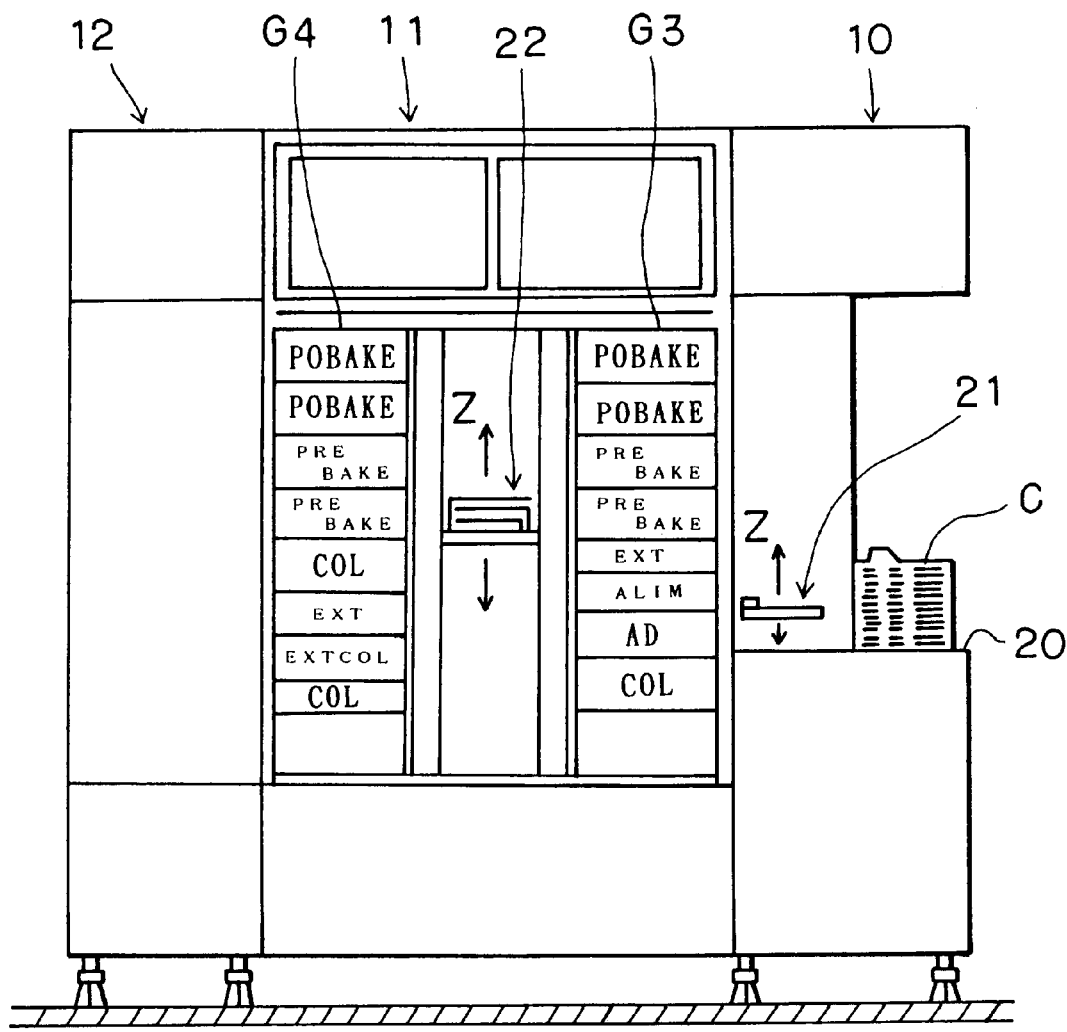
FIG. 3 is a rear view of the coating and developing system shown in FIG. 1.

FIG. 1 is a plane view of a coating and developing system according to an embodiment of the present invention, FIG. 2 is a front view of the coating and developing system shown in FIG. 1, and FIG. 3 is a rear view of the coating and developing system shown in FIG. 1.

As shown in FIG. 1 to FIG. 3, the coating and developing system 1 has a configuration in which a cassette station 10, a processing station 11, and an interface section 12 are integrally connected. In the cassette station 10, a plurality of wafers W, for example, 25 wafers W per cassette C, as a unit, are transferred from/to the outside into/from the coating and developing system 1. The wafer W is carried into/out of the cassette C. In the processing station 11, various kinds of processing units each for applying predetermined processing to the wafers W one by one are multi-tiered in predetermined positions. In the interface section 12, the wafer W is sent and received to/from an aligner 13 provided adjacent to the coating and developing system 1.

In the cassette station 10, a plurality of cassettes C, for example, four cassettes C are mounted with respective transfer ports for the wafer W facing the processing station 11 side at the positions of positioning projections 20a on a cassette mounting table 20 in a line in an X-direction (a vertical direction in FIG. 1). A wafer transfer body 21 movable in the direction of arrangement of the cassettes C (the X-direction) and in the direction of arrangement of the wafers W housed in the cassette C (a Z-direction: a vertical direction) is movable along a transfer path 21a and selectively gets access to each of the cassettes C.

The wafer transfer body 21 is also structured to be rotatable in a θ-direction so that it is accessible to an alignment unit (ALIM) and an extension unit (EXT) included in a multi-tiered unit section in a third processing unit group G3 on the processing station 11 side as described later.

In the processing station 11, as shown in FIG. 1, a vertical transfer-type transfer device 22 is provided in the center thereof. Around the transfer device 22, various kinds of processing units are multi-tiered in one group or plural groups, composing processing unit groups. In the above coating and developing system 1, five processing unit groups G1, G2, G3, G4, and G5 can be arranged. It is possible to arrange the first and second processing unit groups G1 and G2 on the front side of the system, the third processing unit group G3 adjacent to the cassette station 10, the fourth processing unit group G4 adjacent to the interface section 12, and the fifth processing unit group G5 shown by a broken line on the rear side. The transfer device 22 is structured to be rotatable in the θ-direction and movable in the Z-direction so that it can deliver the wafer W between the respective processing units.

In the first processing unit group G1, two spinner-type processing units in which the wafer W is placed on a spin chuck in a cup CP to undergo predetermined processing, for example, a resist solution coating unit (COT) and a scrubbing unit (SCR) are two-tiered from the bottom in order as shown in FIG. 2. In the second processing unit group G2, two spinner-type processing units, for example, a resist solution coating unit (COT) and a developing unit (DEV) are two-tiered from the bottom in order.

As shown in FIG. 2, a high efficiency filter 23, for example, an ULPA filter, is provided in each of the aforesaid three zones (the cassette station 10, the processing station 11, and the interface section 12) at the upper portion of the coating and developing system 1. When air supplied from the upstream side of the high efficiency filter 23 passes through the high efficiency filter 23, particles and organic components therein are collected and removed. Therefore, the downflow of clean air from above is supplied to the cassette mounting table 20, the transfer path 21a of the wafer transfer body 21, the first and second processing unit groups G1 and G2, the third to fifth processing unit groups G3, G4, and G5, and the interface section 12 through the high efficiency filter 23 in the directions shown by the full line arrows or broken line arrows in FIG. 2.

As shown in FIG. 3, in the third processing unit group G3, oven-type processing units in each of which the wafer W is placed on a mounting table to undergo predetermined processing, for example, a cooling unit (COL) for cooling processing, an adhesion unit (AD) for performing so-called hydrophobic processing to enhance fixedness of a resist, an alignment unit (ALIM) for alignment, an extension unit (EXT), a prebaking unit (PREBAKE) for thermal processing before exposure, and a postbaking unit (POBAKE) are, for instance, eight-tiered from the bottom in order.

Similarly, as shown in FIG. 3, in the fourth processing unit group G4, oven-type processing units in each of which the wafer W is mounted on a mounting table to undergo predetermined processing, for example, a cooling unit (COL) for cooling processing, an extension and cooling unit (EXTCOL) serving also for cooling processing, an extension unit (EXT), an adhesion unit (AD), a prebaking unit (PREBAKE), and a postbaking unit (POBAKE) are, for instance, eight-tiered from the bottom in order.

The aforesaid arrangement of a cooling unit (COT) and an extension and cooling unit (EXTCOL) having a low processing temperature at the lower tiers and a prebaking unit (PREBAKE), a postbaking unit (POBAKE), and an adhesion unit (AD) having a high processing temperature at the upper tiers, can reduce thermal mutual interference between units.

As shown in FIG. 1, the interface section 12 is the same as theprocessing station 11 insize in the direction of depth (X-direction) but smaller than the processing station 11 in size in the direction of width. As shown in FIG. 1 and FIG. 2, a transportable pickup cassette CR and a fixed buffer cassette BR are two-tiered at the front of the interface section 12, and a peripheral aligner 24 is disposed at the rear thereof.

A wafer transfer body 25 is provided at the center of the interface section 12. The wafer transfer body 25 moves in the X-direction and the Z-direction (the vertical direction) to be accessible to both the cassettes CR and BR, and the peripheral aligner 24. The wafer transfer body 25 is also rotatable in the θ-direction to be accessible to the extension unit (EXT) included in the fourth processing unit group G4 on the processing station 11 side and to a wafer delivery table (not illustrated) on the adjacent aligner 13 side.

FIG. 4 is a view showing the configuration of a supply system in the aforesaid scrubbing unit (SCR).

As shown in FIG. 4, a spin chuck 31 for rotating the wafer W while holding it is disposed nearly in the middle of the cup CP of the scrubbing unit (SCR).

A scrubbing solution supply nozzle 32 for supplying a scrubbing solution almost to the center on the wafer W held by the spin chuck 31 is disposed above the spin chuck 31. The scrubbing solution supply nozzle 32 is attached to the front end of an arm which is not illustrated, and evacuated to the outside of the cup CP by rotating the arm when the wafer is delivered.

NH4OH is stored in a first tank 33, and H2O2 is stored in a second tank 34. NH4OH stored in the first tank 33 is supplied to a mixing valve 37 as a mixing chamber via a unit pump 35. Likewise, H2O2 stored in the second tank 34 is supplied to the mixing valve 37 via a unit pump 38. The mixing valve 37 has a function of mixing NH4OH, H2O2, and demineralized water to make a scrubbing solution, a function of supplying the scrubbing solution to a wafer, and a function of draining the scrubbing solution, and further has a valve function of switching the storage of the scrubbing solution in the mixing valve, supply of the scrubbing solution to the wafer, and drainage of the scrubbing solution. The supply amounts of NH4OH and H2O2 are controlled respectively by the unit pumps 35 and 38. Demineralized water (DIW) is supplied into the mixing valve 37 through a demineralized water supply line 36. In the mixing valve 37, NH4OH and H2O2 are mixed. By mixing the mixed solution with demineralized water, a predetermined concentration of scrubbing solution is manufactured. Thus, the mixed scrubbing solution is supplied from the mixing valve 37 to the scrubbing solution supply nozzle 32. The scrubbing solution in the mixing valve 37 is drained through a drain line 39 for drainage as required. In regular drainage of scrubbing solution performed in replacement of processing solutions in the first tank 33 and the second tank 34, NH4OH and H2O2 can flow without operating the unit pumps 35 and 38, and hence the pressure of nitrogen gas from an N2 supply line 46 which is supplied to the fist tank 33 and the second tank 34 is utilized. Thereby, old NH4OH and H2O2 which remain in a pipe 80 connecting the unit pump 35 and the mixing valve 37 and a pipe 81 connecting the unit pump 38 and the mixing valve 37 respectively can be completely drained.

A branch pipe 40 is disposed on a side face of the first tank 33. One end of the branch pipe 40 is connected nearly to the uppermost portion of the first tank 33, and the other end thereof is connected nearly to the lowermost portion of the first tank 33. Accordingly, the liquid level in the branch pipe 40 is equal to that in the first tank 33.

In the branch pipe 40, four sensors 41 to 44 (an uppermost limit sensor 41, an upper limit sensor 42, a lower limit sensor 43, and a lowermost limit sensor 44) are disposed from the top in order. Each of the sensors 41 to 44 detects the liquid level in the branch pipe 40 (in the first tank 33) in a non-contact method, for example, by measuring electrostatic capacity.

The lower limit sensor 43 detects a liquid level at which NH4OH stored in the first tank 33 needs to be replenished, and is disposed in a position corresponding to the aforesaid liquid level. The upper limit sensor 42 detects a liquid level at which the replenishment of NH4OH stored in the first tank 33 needs to be stopped, and is disposed in a position corresponding to the aforesaid liquid level. The uppermost limit sensor 41 is a backup sensor to the upper limit sensor 42. Similarly, the lowermost limit sensor 44 is a backup sensor to the lower limit sensor 43. The spaces between the uppermost limit sensor 41 and the upper limit sensor 42, and the lower limit sensor 43 and the lowermost limit sensor 44 each correspond, for example, to the amount of NH4OH required for scrubbing one wafer W in the scrubbing unit (SCR).

NH4OH is supplied to the first tank 33 from an NH4OH supply line 45 on the plant side, and N2 is supplied thereto from the N2 supply line 46 on the plant side. Incidentally, NH4OH is supplied from the vicinity of the bottom of the first tank 33, and N2 is supplied from the top of the first tank 33. A drain line 50 for drainage is connected to the top of the first tank 33. The drain line 50 for drainage is used for draining NH4OH to the outside of the first tank 33 when NH4OH overflows the first tank 33. In regular use, N2 gas and air are supplied respectively from the N2 supply line 46 and an air supply line 48, so that a very small amount of N2 gas is always supplied into the first tank 33 by switching on NH4OH pressurizing air operating valves 51 and 52. The aforesaid configuration allows the inside of the first tank 33 to be pressurized, whereby even if NH4OH remains in the drain line 50, the remaining NH4OH never flows backward into the first tank 33. Further, N2 gas supplied into the first tank 33 is exhausted to the outside of the first tank 33 through the drain line 50 for drainage, thereby draining NH4OH remaining in the drain line 50 to the outside of the first tank 33. Thus, NH4OH remaining in the drain line 50 never flows backward into the first tank 33. As a result, there never arises such a situation that old NH4OH remaining in the drain line 50 and new NH4OH stored in the first tank 33 are mixed.

An NH4OH replenishing air operating valve 47 is provided between the NH4OH supply line 45 and the first tank 33. Air for switching on/off is supplied from the air supply line 48 on the plant side to the NH4OH replenishing air operating valve 47 via an NH4OH replenishing solenoid 49.

The NH4OH pressurizing air operating valve 51 is provided between the N2 supply line 46 and the first tank 33, and the NH4OH atmosphere releasing air operating valve 52 is provided in the drain line 50. Air for switching on/off is supplied from the air supply line 48 on the plant side to the NH4OH pressurizing air operating valve 51 and the NH4OH atmosphere releasing air operating valve 52 via an NH4OH pressurizing solenoid 53.

The second tank 34 is configured similarly to the first tank 33. Specifically, a branch pipe 54 is disposed on a side face of the second tank 34. One end of the branch pipe 54 is connected nearly to the uppermost portion of the second tank 34, and the other end thereof is connected nearly to the lowermost portion of the second tank 34. Accordingly, the liquid level in the branch pipe 54 is equal to that in the second tank 34.

In the branch pipe 54, four sensors 55 to 58 (an uppermost limit sensor 55, an upper limit sensor 56, a lower limit sensor 57, and a lowermost limit sensor 58) are disposed from the top in order. Each of the sensors 55 to 58 detects the liquid level in the branch pipe 54 (in the second tank 34) in the non-contact method, for example, by measuring electrostatic capacity.

The lower limit sensor 57 detects a liquid level at which H2O2 stored in the second tank 34 needs to be replenished, and is disposed in a position corresponding to the aforesaid liquid level. The upper limit sensor 56 detects a liquid level at which the replenishment of H2O2 stored in the second tank 34 needs to be stopped, and is disposed in a position corresponding to the aforesaid liquid level. The uppermost limit sensor 55 is a backup sensor to the upper limit sensor 56. Likewise, the lowermost limit sensor 58 is a backup sensor for the lower limit sensor 57. The spaces between the uppermost limit sensor 55 and the upper limit sensor 56, and the lower limit sensor 57 and the lowermost limit sensor 58 each correspond, for example, to the amount of H2O2 required for scrubbing ten or more wafers W in the scrubbing unit (SCR).

H2O2 is supplied to the second tank 34 from an H2O2 supply line 59 on the plant side, and N2 is supplied thereto from the N2 supply line 46 on the plant side. Incidentally, H2O2 is supplied from the vicinity of the bottom of the second tank 34, and N2 is supplied from the top of the second tank 34. A drain line 60 for drainage is connected to the top of the second tank 34. The drain line 60 for drainage is used for draining H2O2 to the outside of the second tank 34 when H2O2 overflows the second tank 34. In ordinary use, N2 gas and air are supplied respectively from the N2 supply line 46 and the air supply line 48, so that a very small amount of N2 gas is always supplied into the second tank 34 by switching on H2O2 pressurizing air operating valves 63 and 64. The aforesaid configuration allows the inside of the second tank 34 to be pressurized, whereby even if H2O2 remains in the drain line 60, the remaining H2O2 never flows backward into the second tank 34. Further, N2 gas supplied into the second tank 34 is exhausted to the outside of the second tank 34 through the drain line 60 for drainage, thereby draining H2O2 remaining in the drain line 60 to the outside of the second tank 34. Thus, H2O2 remaining in the drain line 60 never flows backward into the second tank 34. As a result, there never arises such a situation that old H2O2 remaining in the drain line 60 and new H2O2 stored in the second tank 34 are mixed. An H2O2 replenishing air operating valve 61 is provided between the H2O2 supply line 59 and the second tank 34. Air for switching on/off is supplied from the air supply line 48 on the plant side to the H2O2 replenishing air operating valve 61 via an H2O2 replenishing solenoid 62.

The H2O2 pressurizing air operating valve 63 is provided between the N2 supply line 46 and the second tank 34, and the H2O2 atmosphere releasing air operating valve 64 is provided in the drain line 60. Air for switching on/off is supplied from the air supply line 48 on the plant side to the H2O2 pressurizing air operating valve 63 and the H2O2 atmosphere releasing air operating valve 64 via an H2O2 pressurizing solenoid 65.

Figure 5:
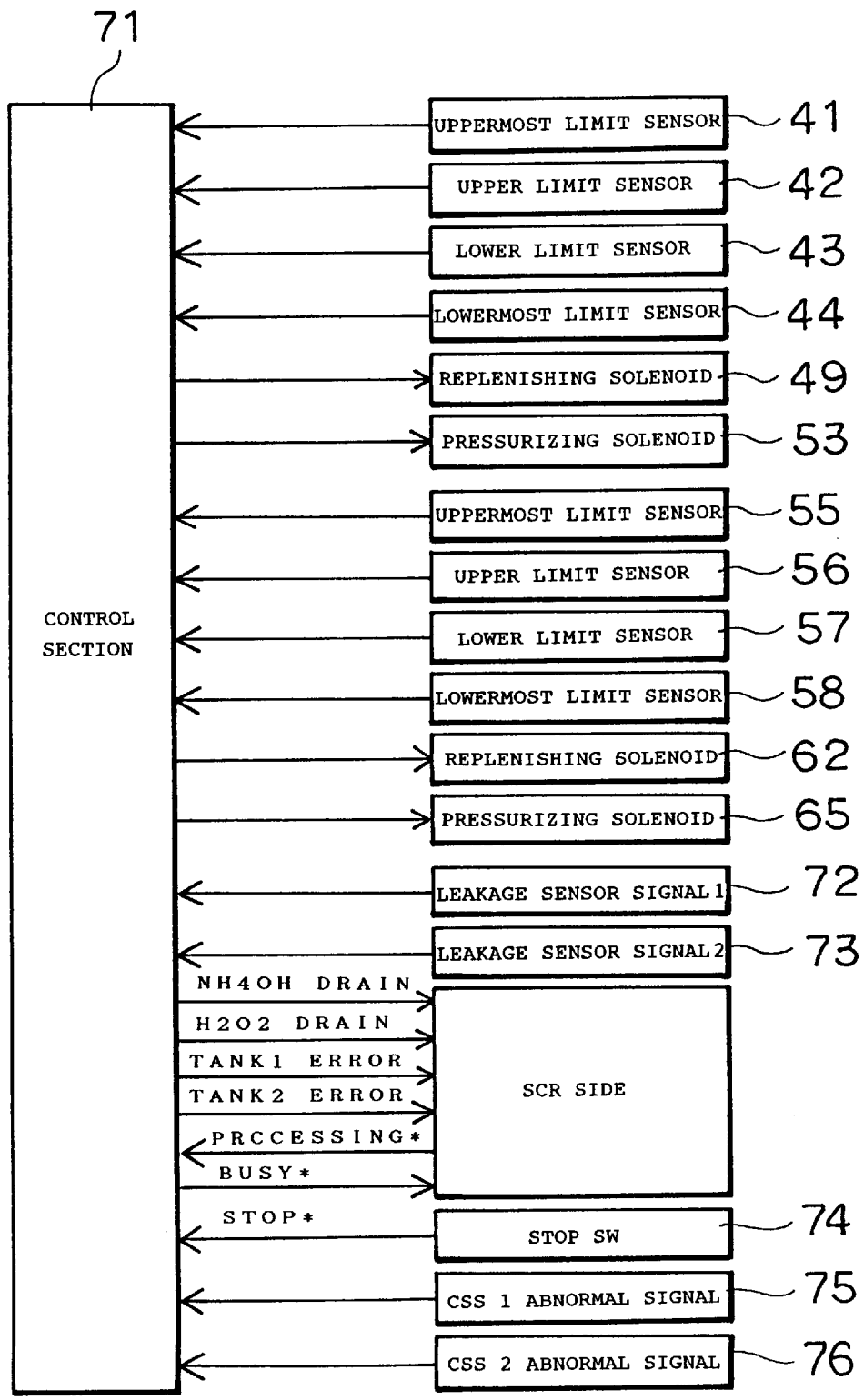
FIG. 5 is a block diagram showing the configuration of a control system in the supply system shown in FIG. 4.

FIG. 5 is a block diagram showing the configuration of a control system in the above supply system.

In FIG. 5, a numeral 71 denotes a control section for wholly controlling the scrubbing unit (SCR) and the supply system to the scrubbing unit (SCR). Connected to the control section 71 are leakage sensors 72 and 73, and a stop switch 74 in addition to the aforesaid scrubbing unit (SCR) side, the uppermost limit sensor 41, the upper limit sensor 42, the lower limit sensor 43, the lowermost limit sensor 44, the NH4OH replenishing solenoid 49, the NH4OH pressurizing solenoid 53, the uppermost limit sensor 55, the upper limit sensor 56, the lower limit sensor 57, the lowermost limit sensor 58, the H2O2 replenishing solenoid 62, and the H2O2 pressurizing solenoid 65. CSSs (terminal boards or connectors) 75 and 76 are also connected to the control section 71. When receiving an abnormal signal from each of the CSSs 75 and 76, the control section 71 stops the operation of this system. Incidentally, the control section 71 is connected to a main control section (not illustrated) for wholly controlling the entire coating and developing system. Moreover, the control section 71 has various kinds of timer functions.

The leakage sensor 72 is a sensor for detecting leakage regarding the first tank 33, and it is disposed, for example, around the first tank 33 or near the piping thereof. The leakage sensor 73 is a sensor for detecting leakage regarding the second tank 34, and it is disposed, for example, around the second tank 34 or near the piping thereof. The stop switch 74 is a switch for stopping operation in the supply system.

A signal (NH4OH DRAIN) for draining NH4OH, a signal (H2O2 DRAIN) for draining H2O2, a signal (TANK1 ERROR) for reporting that an error has occurred in the first tank 33, a signal (TANK2 ERROR) for reporting that an error has occurred in the second tank 34, and a signal (BUSY) for reporting that replenishment or drainage of NH4OH or H2O2 is being performed on the supply side are sent from the control section 71 to the scrubbing unit (SCR). A signal (PROCESSING) for reporting that the scrubbing unit (SCR) is under processing is sent from the scrubbing unit (SCR) to the control section 71.

Figure 6:
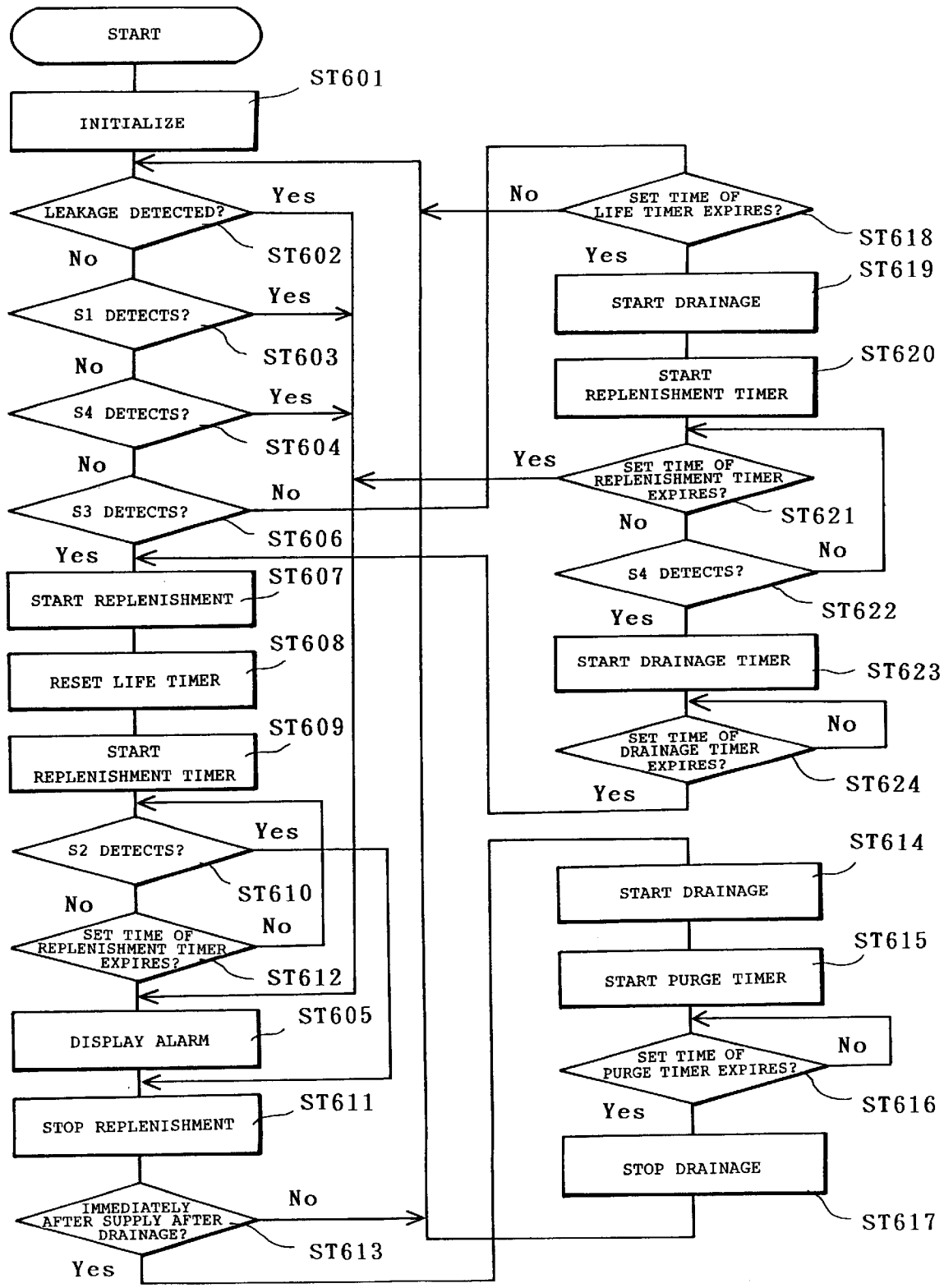
FIG. 6 is a flowchart showing the operation of the supply system shown in FIG. 5.

Next, the operation of the supply system thus configured will be explained based on a flowchart shown in FIG. 6. Incidentally, although in the supply system, the following operation is performed individually on the fist tank 33 side and the second tank 34 side, only the first tank 33 side will be explained in the following explanation.

First, in the control section 71, after the system is initialized (step 601), it is confirmed whether leakage is detected by the leakage sensor 72 (step 602), and further whether a liquid level in the first tank 33 is detected by the uppermost limit sensor 41 or the lowermost limit sensor 44 (steps 603 and 604). When leakage is detected by the leakage sensor 72 or when the liquid level in the first tank 33 is detected by the uppermost limit sensor 41 or the lowermost limit sensor 44, alarm display is performed (step 605) to report the occurrence of an abnormality to a user. In this situation, when leakage is detected, the supply of NH4OH and H2O2 to the first tank 33 and the second tank 34 is stopped, the supply of nitrogen gas into the first tank 33 and the supply of air from the air supply line 48 thereinto are also stepped, and further the supply of a scrubbing solution to a wafer is stopped by the mixing valve 37, thus preventing leakage from increasing. Moreover, when leakage is detected, the drainage of a processing solution is not performed by application of atmospheric pressure, thereby preventing the occurrence of accidents and the like due to application of atmospheric pressure.

Meanwhile, when such an abnormality does not occur, it is confirmed whether a liquid level in the first tank 33 is detected by the lower limit sensor 43 (step 606). When the liquid level in the first tank 33 is detected by the lower limit sensor 43, the NH4OH replenishing air operating valve 47 is opened via the NH4OH replenishing solenoid 49 to start the replenishment of NH4OH from the NH4OH supply line 45 to the first tank 33 (step 607). Concurrently with this, a life timer in the control section 71 is reset (step 608), and a replenishment timer in the control section 71 is started (step 609).

In the life timer, a period of time during which NH4OH can be effectively used is set. In the case of NH4OH, the period of time is set at approximately 40 hours. However, this period of time can be set at the user's discretion. In the replenishment timer, a period of time required for replenishing the first tank 33 with NH4OH is set. This period of time also can be set at the user's discretion. For example, the period of time can be set at zero to 999 seconds, but if it is set at zero second, monitoring by the replenishment timer is eliminated.

After the aforesaid replenishment is started, it is confirmed whether a liquid level in the first tank 33 is detected by the upper limit sensor 42 (step 610). When the liquid level in the first tank 33 is detected by the upper limit sensor 42, replenishment is stopped (step 611). When a set time of the replenishment timer expires before the liquid level in the first tank 33 is detected by the upper limit sensor 42 (step 612), an alarm is displayed (step 605), and thereafter replenishment is stopped (step 611). Thus, the user can know that a crack or the like has occurred in piping, for example.

In the case immediately after supply after drainage (step 613) which is described later, drainage is started while the mixing valve 37 is set to a drainage state (step 614), and at the same time a purge timer in the control section 71 is started (step 615). In the purge timer, a period of time required for draining unnecessary NH4OH remaining in this route after NH4OH is drained from the first tank 33 via the mixing valve 37 is set. Then, when a set time of the purge timer expires (step 616), drainage from the mixing valve 37 is stopped (step 617). When the aforesaid processing is completed, the procedure returns to step 602 and the same processing is repeated.

In the aforesaid step 606, when a set time of the life timer expires without the lower limit sensor 43 detecting the liquid level in the first tank 33, that is, when NH4OH stored in the first tank 33 exceeds an effective period of time (40 hours from replenishment in this embodiment, for example), drainage is started while the mixing valve 37 is set to a drainage state (step 619), and simultaneously the replenishment timer in the control section 71 is started (step 620). When the lowermost limit sensor 44 detects a liquid level in the first tank 33 (step 622) before the set time of the replenishment timer expires (step 621), a drainage timer (for example, set at the same period of time as the replenishment timer) is started (step 623). If a set time of the drainage timer expires (step 624), replenishment in step 607 is started.

When the set time of the replenishment timer expires without the lowermost limit sensor 44 detecting the liquid level in the first tank 33 (step 622), alarm display in step 605 is performed. Thereby, the user can know that clogging or the like has occurred in piping, for example.

FIG. 7 to FIG. 13 are timing charts showing the operation of the aforesaid sensors and the like in various kinds of states.

Figure 7:
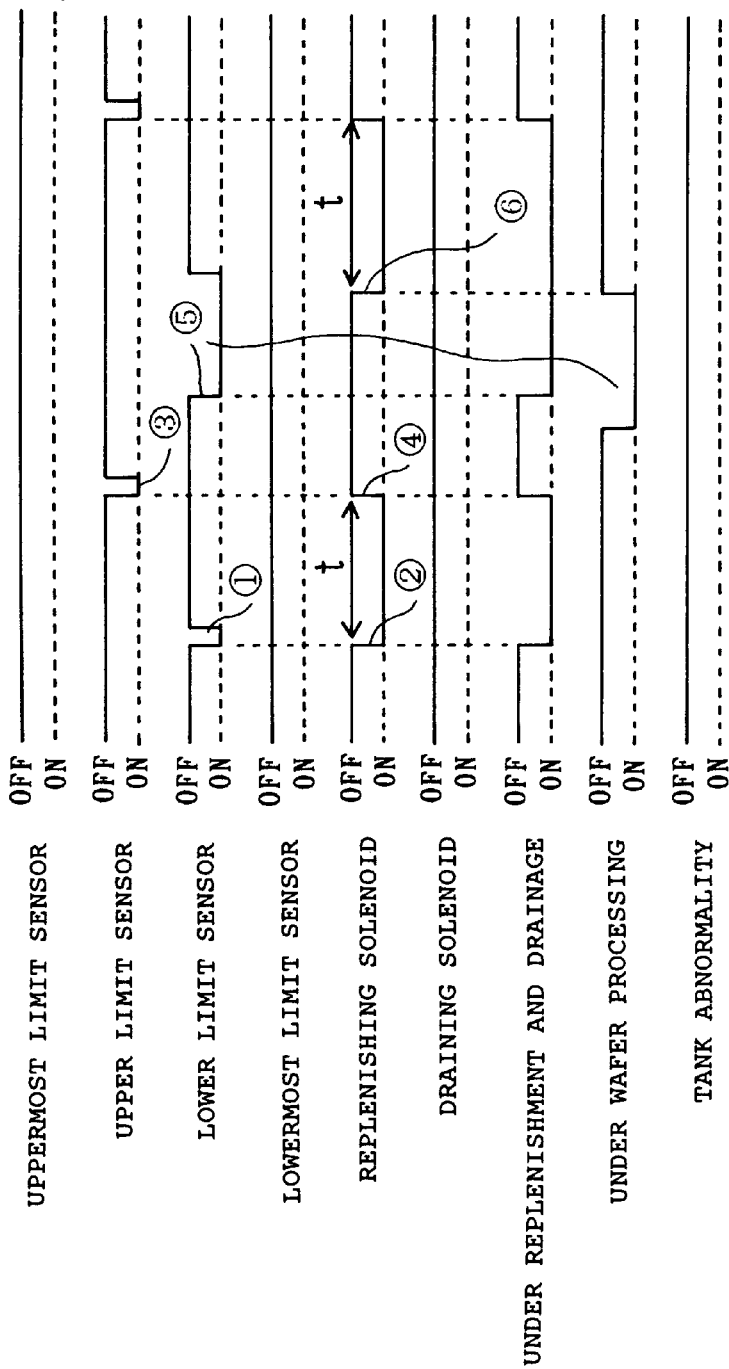
FIG. 7 is a timing chart showing regular replenishment operation according to the embodiment of the present invention.

FIG. 7 is a timing chart showing regular replenishment operation. Specifically, when the liquid level is detected by the lower limit sensor 43 (FIG. 7 ①), replenishment is started (FIG. 7 ②). When the liquid level is detected by the upper limit sensor 42 (FIG. 7 ③), the replenishment is stopped (FIG. 7 ④). If scrubbing processing is being performed in the scrubbing unit (SCR) when the liquid level is detected by the lower limit sensor 43, replenishment is started after the completion of the processing (FIG. 7 ⑥). Incidentally, the life timer is reset at the time of ② and ⑥.

Figure 8:
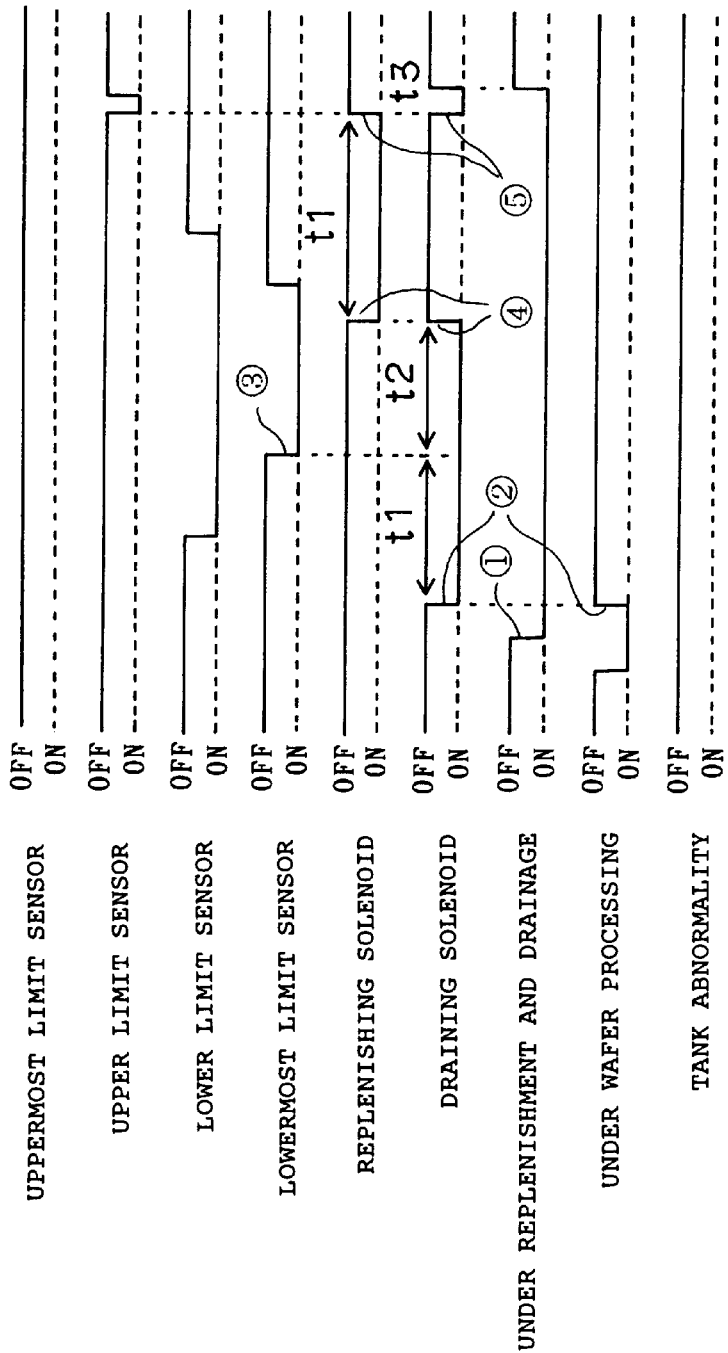
FIG. 8 is a timing chart showing operation from regular drainage (The set time of a life timer expires.) to replenishment according to the embodiment of the present invention.

FIG. 8 is a timing chart showing operation from regular drainage (The set time of the life timer expires.) to replenishment. Specifically, the set time of the life timer expires (FIG. 8 ①) while processing by the scrubbing unit (SCR)

is being performed. Hence, after the completion of the processing, drainage is started (FIG. 8 ②). When the lowermost limit sensor 44 detects the liquid level (FIG. 8 ③) before the set time of the replenishment timer (t1) expires, the drainage timer is started, and further drainage is continued during the period of t2. When the set time of the drainage timer (FIG. 8 ④) expires, replenishment is started. When the replenishment is completed (FIG. 8 ⑤), a purge is performed during the period of t3.

Figure 9:
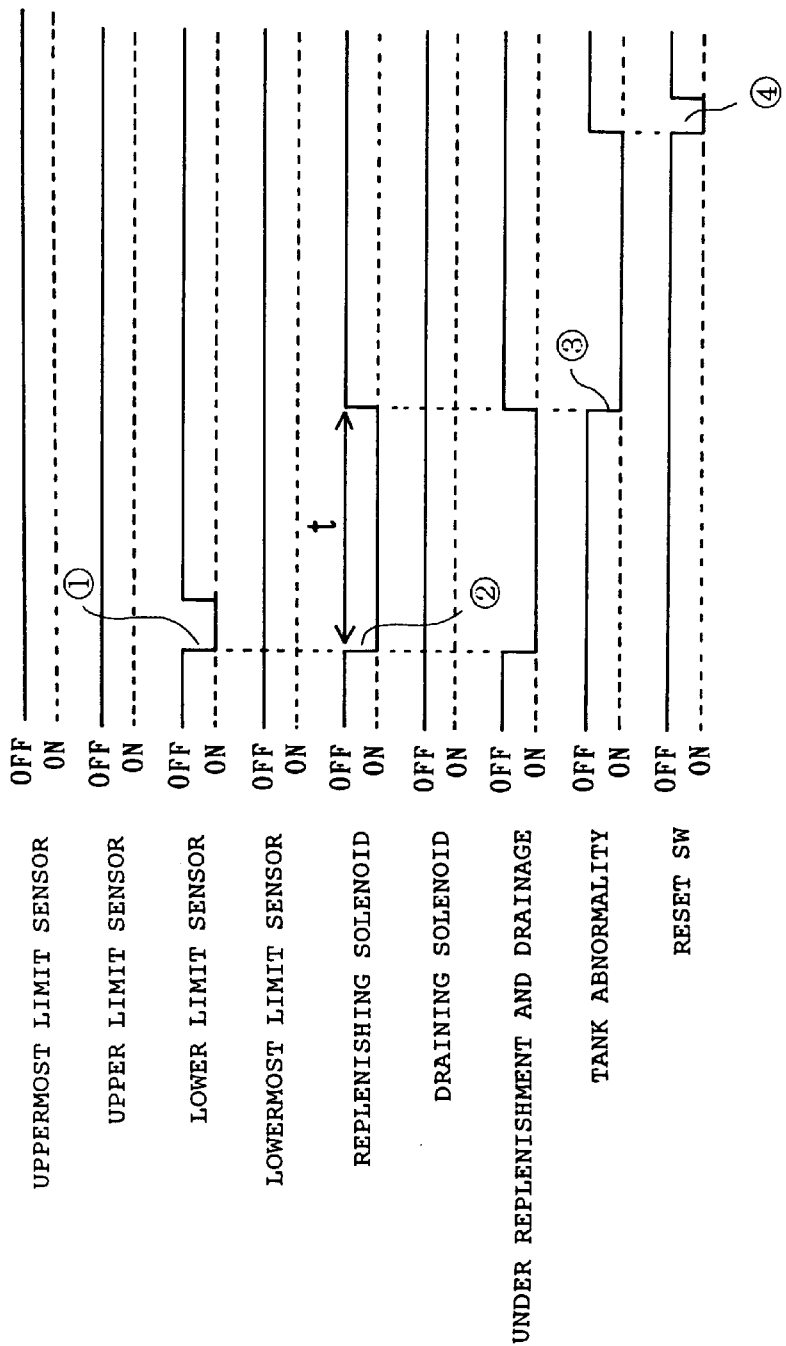
FIG. 9 is a timing chart showing abnormal operation when a set time has expired in replenishment according to the embodiment of the present invention.

FIG. 9 is a timing chart showing abnormal operation when the set time expires in replenishment. Specifically, when the liquid level is detected by the lower limit sensor 43 (FIG. 9 ①), replenishment is started (FIG. 9 ②). When no liquid level is detected by the upper limit sensor 42 although the set time of the replenishment timer expires, tank abnormalities are reported to the scrubbing unit (SCR) side (FIG. 9 ③). Reset is performed after a lapse of a predetermined period of time (FIG. 9 ④).

Figure 10:
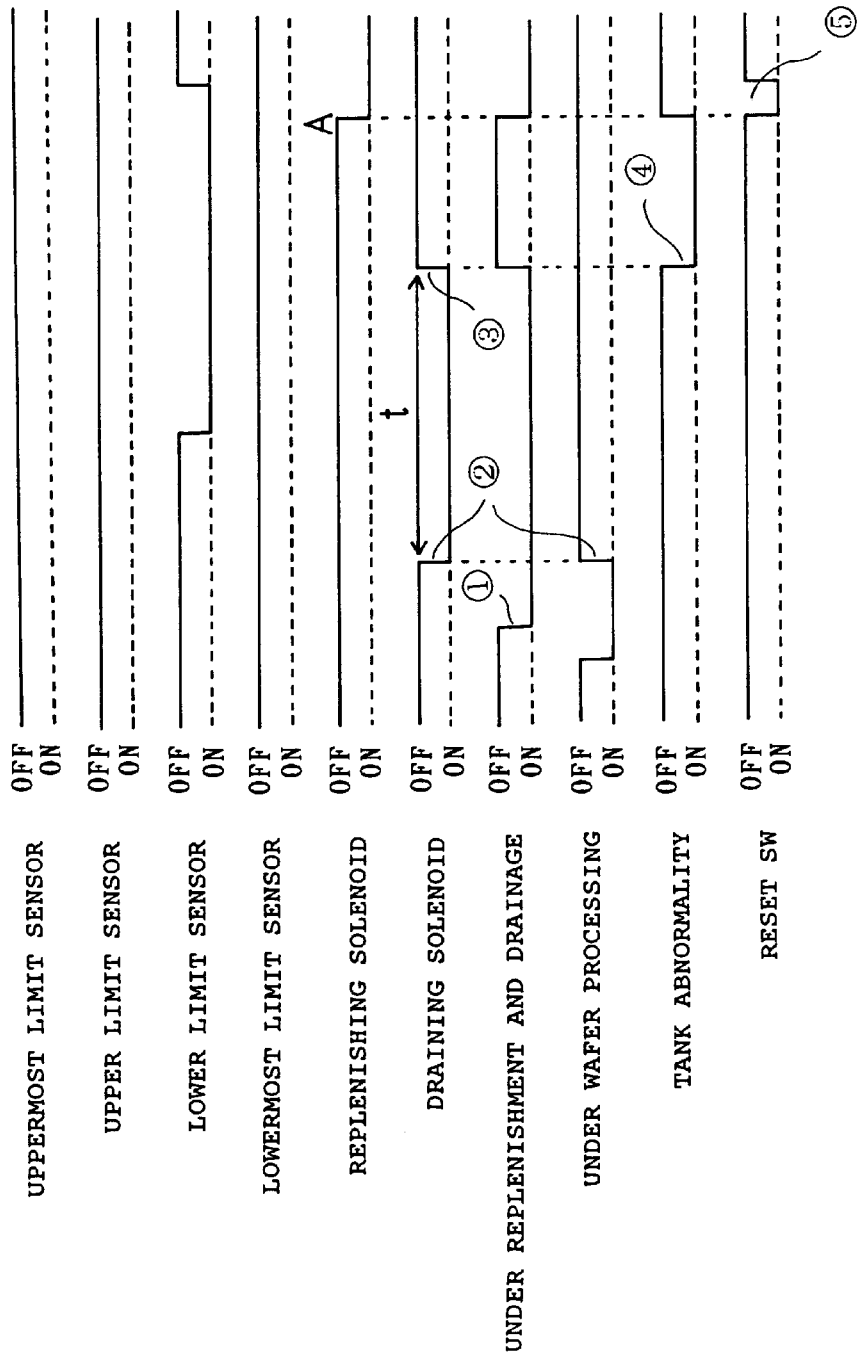
FIG. 10 is a timing chart showing abnormal operation when a set time has expired in regular drainage according to the embodiment of the present invention.

FIG. 10 is a timing chart showing abnormal operation when the set time expires in ordinary drainage. Specifically, the set time of the life timer expires (FIG. 10 ①) at which time processing by the scrubbing unit (SCR) is being performed. Hence, after the completion of the processing, drainage is started (FIG. 10 ②). When no liquid level is detected by the lowermost limit sensor 44 (FIG. 10 ③) although the set time of the replenishment timer expires (t), tank abnormalities are reported to the scrubbing unit (SCR) side (FIG. 10 ④). Reset is performed after a lapse of a predetermined period of time (FIG. 10 ⑤).

Figure 11:
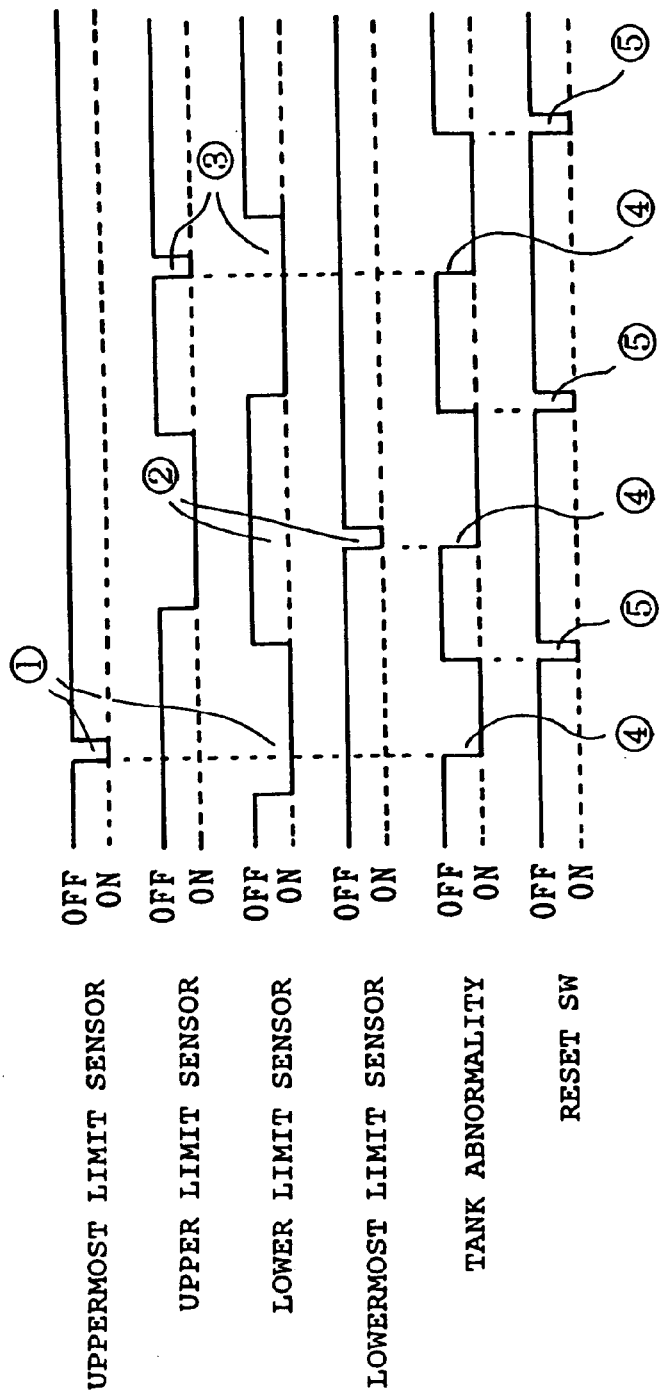
FIG. 11 is a timing chart showing operation when a sensor is abnormal according to the embodiment of the present invention.

FIG. 11 is a timing chart showing operation when a sensor is abnormal. Specifically, when some contradiction occurs between the sensors, for example, when the uppermost limit sensor 41 detects a liquid level although the lower limit sensor 43 does not detect any liquid level (FIG. 11 ①), when the lowermost limit sensor 44 does not detect any liquid level although the lower limit sensor 43 detects a liquid level (FIG. 11 ②), or when the upper limit sensor 42 detects a liquid level although the lower limit sensor 43 does not detect any liquid level (FIG. 11 ③), tank abnormalities are reported to the scrubbing unit (SCR) side (FIG. 11 ④). Reset is performed after a lapse of a predetermined period of time (FIG. 11 ⑤).

Figure 12:
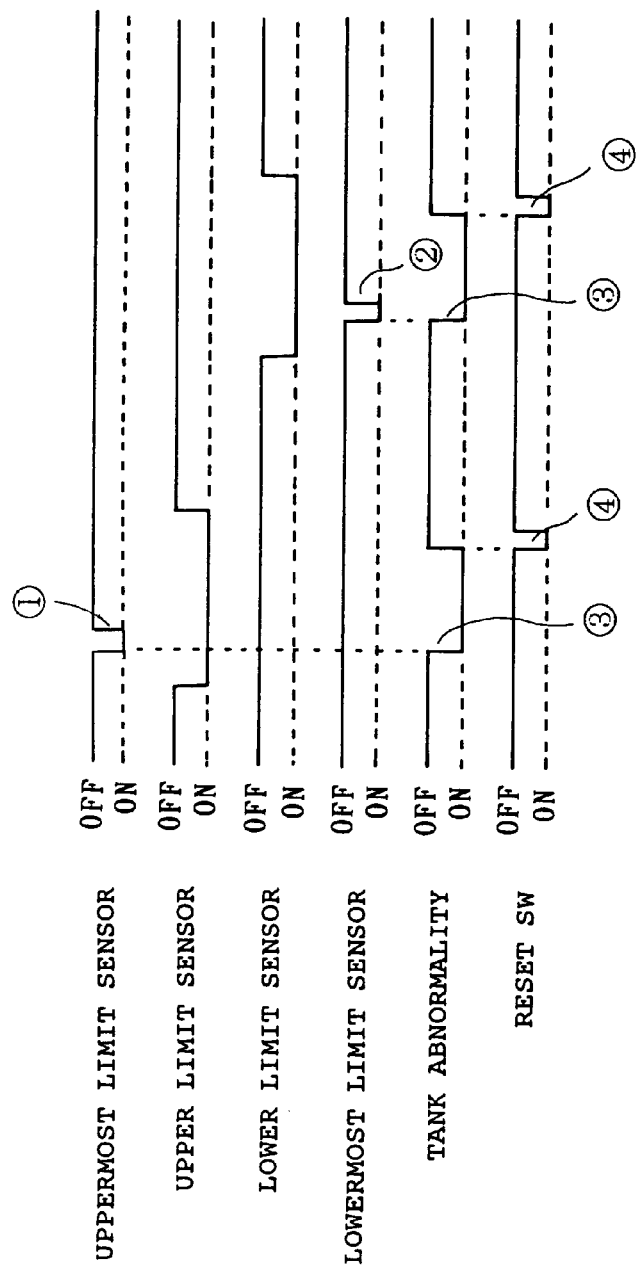
FIG. 12 is a timing chart showing operation in an empty and an overflowing state according to the embodiment of the present invention.

FIG. 12 is a timing chart showing operation in an empty and an overflowing state. Specifically, when the uppermost limit sensor 41 detect a liquid level (FIG. 12 ①) and the lowermost limit sensor 44 does not detect any liquid level (FIG. 12 ②), tank abnormalities are reported to the scrubbing unit (SCR) side (FIG. 12 ③). Reset is performed after a lapse of a predetermined period of time (FIG. 12 ④).

Figure 13:
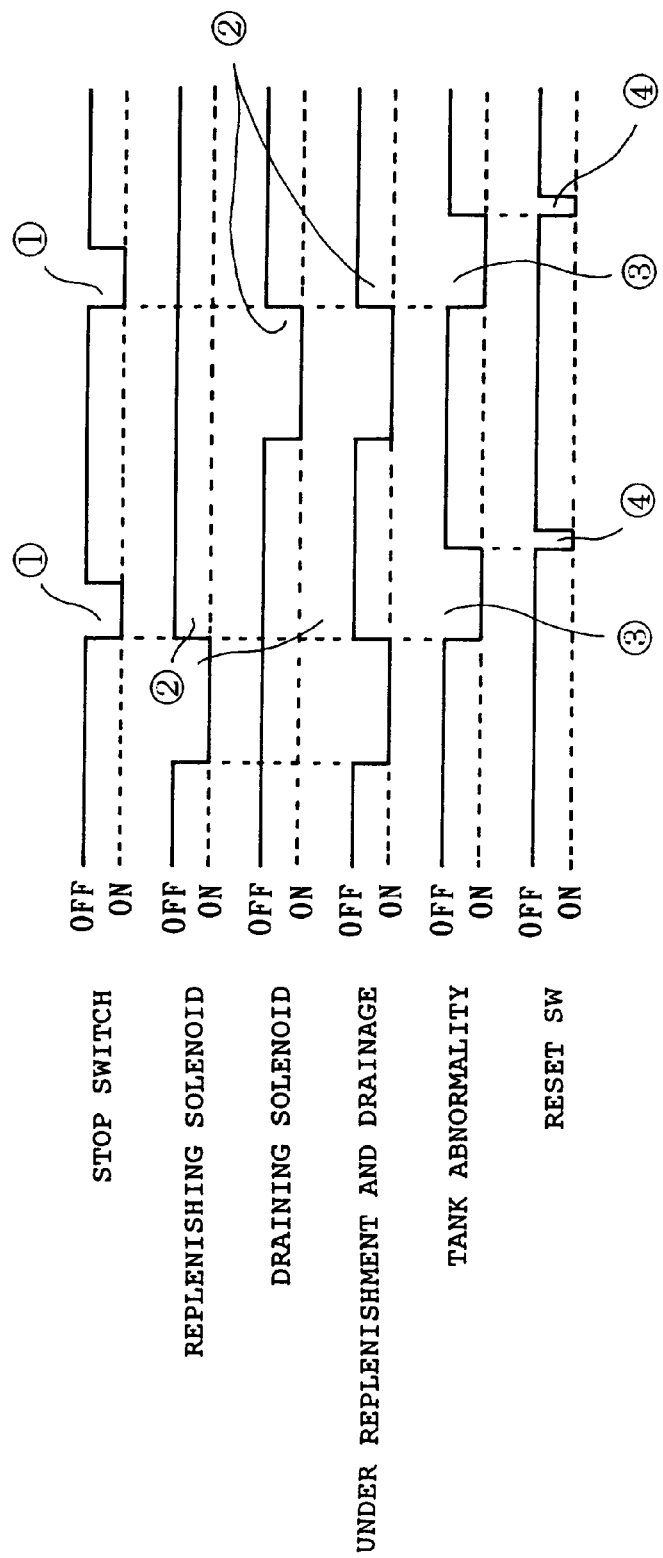
FIG. 13 is a timing chart showing operation when a stop switch is on according to the embodiment of the present invention.

FIG. 13 is a timing chart showing operation when the stop switch is on. Specifically, when the stop switch 74 is turned on by the user (FIG. 13 ①), operation in each section is stopped (FIG. 13 ②), and tank abnormalities are reported to the scrubbing unit (SCR) side (FIG. 13 ③). Reset is performed after a lapse of a predetermined period of time (FIG. 13 ④).

As described above, according to this embodiment, when a pipe for sending NH4OH from the first tank 33 to the scrubbing unit (SCR) is clogged, for example, no liquid level is detected by the lowermost limit sensor 44 before the set time of the replenishment timer expires, whereby replenishment of NH4OH is not started. Consequently, there never arises such a situation that remaining NH4OH and new NH4OH are mixed in the first tank 33.

Further, when leakage of a processing solution due to a crack or the like occurs in a pipe for sending NH4OH from the first tank 33 to the scrubbing unit (SCR), for example, no liquid level is detected by the upper limit sensor 42 even if the set time of the replenishment timer expires, thereby stopping replenishing the first tank 33 with NH4OH.

It should be mentioned that the present invention is not limited to the above embodiment.

For example, only the operation regarding the first tank 33 is explained in the above embodiment, but also regarding the second tank 34, the same operation is performed.

In the above embodiment, immediately after the set time of the life timer expires, a processing solution is replaced. However, it is suitable that when the set time of the life timer expires, this is stored in storage means or a flag is set, and that when a processing request is made from the scrubbing unit side, the replacement of a processing solution in the tank is performed only after the content of the storage means or the flag is read. Thus, even when the system is stopped for a long period of time, for example, during the summer vacation, a processing solution in the tank is replaced only once during the summer vacation, thereby eliminating waste of a processing solution.

Further, the present invention can be naturally applied to not only the wafer W but also other objects to be processed, for example, an LCD substrate and the like as objects to be processed.

As explained above, according to the present invention, when a pipe for sending a processing solution from a container to the scrubbing unit is clogged, for example, the replenishment of the container with a new processing solution is not started. As a result, there never arises such a situation that an old processing solution remaining in the container and a new processing solution are mixed. Further, according to the present invention, when leakage of a processing solution due to a crack or the like occurs in the pipe for sending the processing solution from the container to the scrubbing unit, for example, the replenishment of the container with a processing solution is stopped. Consequently, the replacement of a processing solution in the container can be smoothly performed.

According to the present invention, the user can know the occurrence of abnormalities such as clogging, a crack, and the like in a pipe by reporting means.

According to the present invention, the replacement of a processing solution in the container is not performed until a processing request is made from a processing unit, whereby the processing solution in the container is replaced only once during the summer vacation, for example, thereby eliminating waste of a processing solution.

Further, according to the present invention, leakage of a processing solution from the container is detected prior to automatic replacement of the processing solution in the container. Thus, the replacement of the processing solution can be performed more smoothly.

The aforesaid embodiment has the intention of clarifying technical meaning of the present invention. Therefore, the present invention is not intended to be limited to the above concrete embodiment and to be interpreted in a narrow sense, and various changes may be made therein without departing from the spirit of the present invention and within the meaning of the claims.

What is claimed is:

1. A feeding apparatus for feeding a processing solution to a processing apparatus for performing predetermined processing, comprising:

a container for storing the processing solution to be supplied to the processing apparatus;

a first sensor for detecting a first liquid level at which the processing solution stored in said container needs to be replenished;

a second sensor for detecting a second liquid level lower than the first liquid level;

replenishing means for replenishing said container with a processing solution when the first liquid level is detected by said first sensor;

a first timer starting to operate when the processing solution is replenished by said replenishing means and measuring time for a predetermined period of time;

means for starting drainage of the processing solution in said container when the set time of said first timer expires without said first sensor detecting the first liquid level;

a second timer starting to operate when drainage of the processing solution in said container is started and measuring time for a predetermined period of time; and means for starting replenishment of said container with a processing solution when the second liquid level is detected by said second sensor before the set time of said second timer expires.

2. The apparatus as set forth in claim 1, further comprising:

reporting means for giving a predetermined report when the second liquid level is not detected by said second sensor although the set time of said second timer expires.

3. The apparatus as set forth in claim 1, wherein when supply of a processing solution is requested by the processing apparatus while said container is replenished with a processing solution, the replenishment of the processing solution is suspended and resumed after the supply of the processing solution to the processing apparatus is stopped.

4. The apparatus as set forth in claim 3, wherein measurement of time by said timer is stopped while the supply of the processing solution is stopped.

5. The apparatus as set forth in claim 1, wherein the apparatus has at least two of said containers in order to mix at least two kinds of processing solutions and supply them to the processing apparatus.

6. The apparatus as set forth in claim 1, wherein the processing solution and demineralized water are mixed and then supplied to the processing apparatus.

7. The apparatus as set forth in claim 5, further comprising:

a mixing chamber for making a mixed solution by mixing at least two kinds of the processing solutions and supplying the mixed solution to the processing apparatus or for draining the processing solution remaining in a processing solution supply system line from said container to the processing apparatus by application of atmospheric pressure.

8. A feeding apparatus for feeding a processing solution to a processing apparatus for performing predetermined processing, comprising:

a container for storing the processing solution to be supplied to the processing apparatus;

a first sensor for detecting a first liquid level at which the processing solution stored in said container needs to be replenished;

a second sensor for detecting a second liquid level at which replenishment of the processing solution needs to be stopped;

means for starting replenishment of said container with a processing solution when the first liquid level is detected by said first sensor;

a timer starting to operate when the replenishment of the processing solution is started and measuring time for a predetermined period of time; and means for stopping the replenishment of the processing solution when the second liquid level is not detected by said second sensor although the set time of said timer expires.

9. The apparatus as set forth in claim 8, further comprising:

reporting means for giving a predetermined report when the second liquid level is not detected by said second sensor although the set time of said timer expires.

10. A feeding apparatus for feeding a processing solution to a processing apparatus for performing predetermined processing, comprising:

a container for storing the processing solution to be supplied to the processing apparatus;

a sensor for detecting a liquid level at which the processing solution stored in said container needs to be replenished;

replenishing means for replenishing said container with a processing solution when the liquid level at which the processing solution needs to be replenished is detected by said sensor;

a timer starting to operate when the processing solution is replenished by said replenishing means and measuring time for a predetermined period of time;

retaining means for retaining this result when the set time of said timer expires without said sensor detecting the liquid level at which the processing solution needs to be replenished; and means for draining the processing solution in said container and replenishing said container with a new processing solution when the replenishment of a processing solution is requested by the processing apparatus and the aforesaid result is retained by said retaining means.

11. A feeding apparatus for feeding a processing solution to a processing apparatus for performing predetermined processing, comprising:

a container for storing the processing solution to be supplied to the processing apparatus and having a discharge port for discharging the processing solution and an exhaust port for exhausting gas in said container;

opening and closing means for opening and closing the exhaust port;

a pump for discharging the processing solution stored in said container through the discharge port and supplying it to the processing apparatus; and gas supplying means for supplying gas into said container to cause the processing solution stored in said container to be discharged and drained through the discharge port, wherein when the processing solution stored in said container is supplied to the processing apparatus by said pump, the exhaust port is slightly opened by said opening and closing means, and a small amount of the gas is supplied into said container by said gas supplying means.

12. A method for replenishing a container with a processing solution in a feeding apparatus for feeding a processing solution from the container storing the processing solution to a processing apparatus for performing predetermined processing, comprising the steps of:

(a) detecting leakage of the processing solution from the container; and (b) next to said step (a), replenishing the container with a processing solution, after the processing solution is drained when the processing solution remains in the container over a predetermined period of time, or after the determination is made when the processing solution does not remain over the predetermined period of time.

13. The method as set forth in claim 12, further comprising the step of:

(c) detecting whether or not the processing apparatus is under processing, receiving the supply of the processing solution from the container, when the leakage of the processing solution is detected in said step (a).

14. The method as set forth in claim 13, further comprising the step of:

detecting whether or not the processing solution remains in a processing solution supply line from the container to the processing apparatus when the processing apparatus is under processing.

15. The method as set forth in claim 14, wherein when the remaining amount of the processing solution in the processing solution supply line is more than a predetermined amount, after an object to be processed is processed, processing is stopped to a predetermined processing step or for a predetermined period of time in the processing apparatus.

16. The method as set forth in claim 13, further comprising the step of:

draining the processing solution remaining in the processing solution supply line from the container to the processing apparatus by application of atmospheric pressure, wherein when the leakage of the processing solution is detected, the drainage of the processing solution is not performed by the application of atmospheric pressure.

17. The method as set forth in claim 12, wherein in at least either of the case where the leakage of the processing solution is detected in said step (a) or the case where processing is being performed at the processing apparatus side, the replenishment of the container with the processing solution is not performed.

18. The method as set forth in claim 12, further comprising the step of:

(d) detecting whether or not more than a predetermined amount of processing solution remains in the container before said step (b).

19. The method as set forth in claim 18, further comprising the step of:

(e) detecting whether or not the processing apparatus is under processing, receiving the supply of the processing solution from the container when the remnant of more than the predetermined amount of the processing solution in the container is detected in said step (d).

20. The method as set forth in claim 19, further comprising the step of:

detecting whether or not the processing solution remains in a processing solution supply line from the container to the processing apparatus when the processing apparatus is under processing.

21. The method as set forth in claim 20, wherein when the remaining amount of the processing solution in the processing solution supply line is more than the predetermined amount, after an object to be processed is processed, processing is stopped to a predetermined processing step or for a predetermined period of time in the processing apparatus.

22. The method as set forth in claim 19, further comprising the step of:

draining the processing solution remaining in the processing solution supply line from the container to the processing apparatus by application of atmospheric pressure, wherein when the remnant of more than the predetermined amount of the processing solution in the container is detected, the drainage of the processing solution is not performed by the application of atmospheric pressure.

23. The method as set forth in claim 18, wherein the replenishment of the container with the processing solution is not performed when the remnant of more than the predetermined amount of the processing solution in the container is detected in said step (d).

24. The method as set forth in claim 12, further comprising the steps of:

supplying gas into the container; and (f) stopping the replenishment of the container with the processing solution and the supply of the gas and stopping the supply of the processing solution to the processing apparatus when the leakage of the processing solution is detected in said step (a).

* * * * *